United States Patent
Arami (10) Patent No.: US 12,020,975 B2
(45) Date of Patent: Jun. 25, 2024

(54) APPARATUS AND METHOD FOR PROCESSING WAFER

(71) Applicant: Piotech Inc., Shenyang (CN)

(72) Inventor: Junichi Arami, Shenyang (CN)

(73) Assignee: Piotech Inc., Shenyang (CN)

( * ) Notice: Subject to any disclaimer, the term of this patent is extended or adjusted under 35 U.S.C. 154(b) by 424 days.

(21) Appl. No.: 17/236,118

(22) Filed: Apr. 21, 2021

(65) Prior Publication Data

US 2021/0375661 A1    Dec. 2, 2021

(30) Foreign Application Priority Data

Jun. 2, 2020  (CN) .......................... 202010489623.5

(51) Int. Cl.
*H01L 21/687* (2006.01)
*H01L 21/324* (2006.01)
*H01L 21/67* (2006.01)

(52) U.S. Cl.
CPC ...... *H01L 21/68735* (2013.01); *H01L 21/324* (2013.01); *H01L 21/67098* (2013.01); *H01L 21/68742* (2013.01)

(58) Field of Classification Search
CPC ......... H01L 21/68721; H01L 21/68735; H01L 21/68785
See application file for complete search history.

(56) References Cited

U.S. PATENT DOCUMENTS

| 5,888,304 | A | 3/1999 | Umotoy et al. |
| 2001/0025783 | A1 | 10/2001 | Sundarrajan et al. |
| 2002/0144786 | A1* | 10/2002 | Chiang ............. C23C 16/45561 156/345.52 |
| 2006/0016398 | A1 | 1/2006 | Dubost et al. |
| 2008/0152838 | A1* | 6/2008 | Sen .................. C23C 16/45521 427/569 |
| 2012/0094502 | A1 | 4/2012 | Shin et al. |
| 2021/0134599 | A1* | 5/2021 | Ramaswamy ...... H01J 37/3053 |

FOREIGN PATENT DOCUMENTS

TW    201234449 A    8/2012

OTHER PUBLICATIONS

First Office Action dated Feb. 22, 2022 in counterpart Taiwan Application No. 110114801.

* cited by examiner

*Primary Examiner* — Jae Lee
(74) *Attorney, Agent, or Firm* — Blank Rome LLP (57) ABSTRACT

This application relates to an apparatus and method for processing a wafer. In an embodiment of this application, an apparatus for processing a wafer includes: a heater including a pedestal, where a top portion of the pedestal includes an annular edge step and a wafer pocket recessed relative to the annular edge step to accommodate a wafer; a side ring, including an outer portion and a top portion, where the outer portion surrounds an outer side wall of the pedestal, and the top portion covers an outer portion of the annular edge step and includes a centripetal slant bevel; and a shadow ring, a bottom portion thereof including a slant bevel matching the centripetal slant bevel of the top portion of the side ring.

7 Claims, 14 Drawing Sheets

APPARATUS AND METHOD FOR PROCESSING WAFER

CROSS-REFERENCE TO RELATED APPLICATIONS

This application claims priority to Chinese Patent Application No. 202010489623.5 filed on Jun. 2, 2020, and all the benefits accruing therefrom under 35 U.S.C. § 119, the contents of which in its entirety are herein incorporated by reference.

BACKGROUND OF THE INVENTION

1. Field of the Invention

The present disclosure relates to the field of semiconductor wafer processing, and in particular, to a shielding component in a semiconductor processing chamber, which is configured to prevent deposition around a wafer during processing.

2. Description of the Related Art

A semiconductor manufacturing process may include deposition processing, such as chemical vapor deposition (CVD) and plasma-enhanced chemical vapor deposition (PECVD), to form various films on a wafer or a substrate to prepare a semiconductor device, such as an integrated circuit and a semiconductor light emitting device. A wafer pocket on a top portion of a pedestal may be configured to carry the wafer or the substrate for the deposition processing. The pedestal may further heat the wafer with a heating means.

In a deposition process, a film formed by the deposition processing may extend to an edge and even a side of the wafer when the edge of the wafer is not shadowed or shielded. This part of the film may collide with a protruding part of a ceramic ring of the wafer pocket, which may cause the film to break. Particles and dust caused by the break may adhere to the surface of the film to form defects.

Therefore, a shielding component is developed to be used to cover an edge of the wafer or the substrate, to prevent plasma from being deposited on the edge and even the side of the wafer. However, it is difficult to ensure that a center of the shielding component is always aligned with a center of the wafer or the substrate in the deposition process. Once eccentricity occurs, a shielding effect of the shielding component on the edge and the side of the wafer is greatly reduced. For example, the eccentricity may result in uneven shielding, and may further result in deposition on an edge and a side of the wafer where deposition is not desired, and no effective deposition on a surface of the wafer where deposition is desired.

Therefore, it is necessary to develop an apparatus and method for processing a wafer, to prevent the center of the shielding component from being eccentric to the center of the wafer or the substrate in the entire deposition process.

SUMMARY OF THE INVENTION

An objective of this application is to provide an apparatus and method for processing a wafer, so that a center of a shielding component and a center of a wafer or a substrate are always automatically aligned without eccentricity in an entire deposition process, while there is no significant increase in costs and process complexity.

An embodiment of this application provides an apparatus for processing a wafer. The apparatus includes: a heater including a pedestal, where a top portion of the pedestal includes an annular edge step and a wafer pocket recessed relative to the annular edge step to accommodate a wafer; a side ring including an outer portion and a top portion, where the outer portion surrounds an outer side wall of the pedestal, and the top portion covers an outer portion of the annular edge step and includes a centripetal slant bevel; and a shadow ring, where a bottom portion of the shadow ring includes a slant bevel matching the centripetal slant bevel of the top portion of the side ring.

Another embodiment of this application provides a method for processing a wafer by using the foregoing apparatus for processing a wafer. The method includes: placing a wafer in the wafer pocket; and lifting the pedestal and the side ring, so that the centripetal slant bevel of the top portion of the side ring comes into contact with the slant bevel of the bottom portion of the shadow ring.

Still another embodiment of this application provides an apparatus for processing a wafer. The apparatus includes: a heater including a pedestal, where a top portion of the pedestal includes an annular edge step and a wafer pocket recessed relative to the annular edge step to accommodate a wafer; and a shadow ring including a side wall and a shielding portion extending inward from the side wall, where when the shadow ring is disposed on the pedestal, the side wall surrounds an outer side wall of the pedestal, and the shielding portion covers and extends beyond the annular edge step.

Still yet another embodiment of this application provides a method for processing a wafer by using the foregoing apparatus for processing a wafer. The method includes: placing a wafer in the wafer pocket; and lifting the pedestal, so that the pedestal comes into contact with the shielding portion of the shadow ring.

It should be understood that the broad forms of the present invention and respective features thereof may be used in combination, interchangeably and/or independently, and are not intended to limit the reference to a single broad form.

PREFERRED EMBODIMENT OF THE PRESENT INVENTION

To better understand the spirit of the present disclosure, a further description is provided below in conjunction with some preferred embodiments of the present disclosure.

In this specification, unless specifically specified or defined, relative terms such as: "central", "longitudinal", "lateral", "front", "rear", "right", "left", "inner", "outer", "low", "high", "horizontal", "vertical", "higher", "lower", "above", "below", "top portion", "bottom portion", and their derivative terms (such as "horizontally", "downward", "upward", and the like) should be interpreted as referring to directions described in the discussion or shown in the accompanying drawings. These relative terms are merely used for ease of description, and do not require constructing or operating this application in a specific direction.

Hereinafter, various implementations of the present disclosure will be described in detail. Although specific implementations are discussed, it should be understood that these implementations are merely described for purpose of illustration. A person skilled in the relevant art will recognize that other components and configurations may be used without departing from the spirit and the protection scope of the present disclosure.

Figure 1:
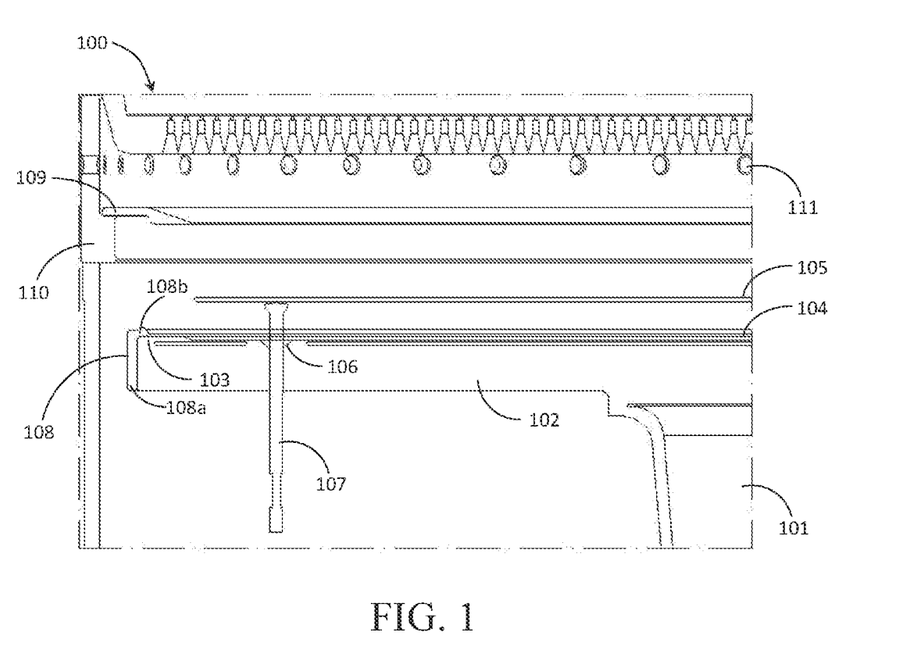
FIG. 1 is a partial cross-sectional view of providing a wafer to an apparatus for processing a wafer.

FIG. 1 is a partial cross-sectional view of an apparatus 100 for processing a wafer. The apparatus 100 for processing a wafer may be configured to, for example, implement deposition processing.

The apparatus 100 for processing a wafer includes a heater 101. The heater 101 may heat a wafer to facilitate the deposition processing. As can be understood, the heater 101 may alternatively not have or not enable a heating function. The heater may be a ceramic heater, an aluminum heater, or any suitable heater. A top portion of the heater 101 includes a pedestal 102. A top portion of the pedestal 102 includes an annular edge step 103 and a wafer pocket 104. The wafer pocket 104 is recessed relative to the annular edge step 103 to accommodate or receive a wafer 105. From a top view, the annular edge step 103 surrounds or encloses the wafer pocket 104. When the wafer pocket 104 accommodates or receives the wafer 105, the annular edge step 103 surrounds or encloses both the wafer pocket 104 and the wafer 105 therein. In an embodiment, a through hole 106 and a lifter pin 107 may be included in a region of the wafer pocket 104 of the pedestal 102. The through hole 106 penetrates the pedestal 102. The lifter pin 107 may move up and down in the through hole 106. A top portion of the through hole 106 may be provided with a receiving groove. A top portion of the lifter pin 107 may be provided with a protruding portion. The lifter pin 107 may stop moving down due to the protruding portion thereof being received into the receiving groove of the through hole 106. Although FIG. 1 merely shows one through hole 106 and one lifter pin 107, a person skilled in the art may understand that more through holes 106 and/or more lifter pins 107 may be included in the region of the wafer pocket 104.

The apparatus 100 for processing a wafer further includes a side ring 108. The side ring 108 is disposed on an edge of the pedestal 102 of the heater 101. The side ring 108 includes an outer portion 108a and a top portion 108b. The outer portion 108a surrounds an outer side wall of the pedestal 102, so that the side ring 108, the pedestal 102, and the wafer pocket 104 on the pedestal 102 can implement center alignment. The top portion 108b covers an outer portion of the annular edge step 103 and includes a centripetal slant bevel.

The apparatus 100 for processing a wafer further includes a shadow ring 109. A bottom portion of the shadow ring 109 includes a slant bevel that matches the centripetal slant bevel of the top portion 108b of the side ring 108. The shadow ring may further include a supporting portion extending outward from the slant bevel. In the embodiment shown in FIG. 1, the side ring 108 and the pedestal 102 of the heater 101 are both located below the shadow ring 109 and separated from the shadow ring 109. The wafer 105 is suspended above the wafer pocket 104 by the support of the lifter pin 107.

In a preferred embodiment, the apparatus 100 for processing a wafer may include a pumping ring 110. The deposition processing may be implemented on the wafer 105 in a substantially enclosed region formed by the wafer pocket 104, the pumping ring 110, and a showerhead above the wafer 105. According to some embodiments of the present disclosure, a side wall of the pumping ring 110 may further include one or more vent holes 111. The vent holes 111 may be connected to an external vacuum pump (not shown) to extract reaction gas. An inner side wall of the pumping ring 110 may include a step or an inner wall stopper to support the shadow ring 109. According to some embodiments of the present disclosure, the step or the inner wall stopper on the inner side wall of the pumping ring 110 may merely support the supporting portion of the shadow ring 109. As can be understood, the shadow ring 109 may alternatively be separately suspended above the heater 101 without relying on the support of the step or the inner wall stopper.

Figure 2:
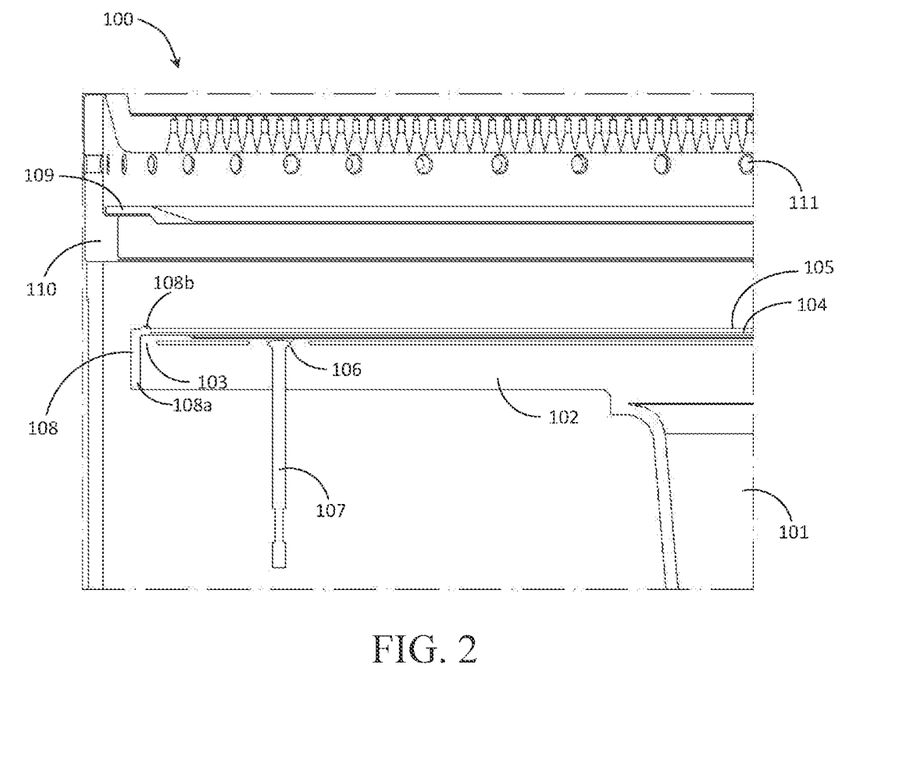
FIG. 2 is a partial cross-sectional view of accommodating a wafer into a wafer pocket of an apparatus for processing a wafer.

FIG. 2 shows that the lifter pin 107 in FIG. 1 descends to guide the wafer 105 to descend and to be accommodated into the wafer pocket 104 to be in direct contact with a surface of the wafer pocket 104. After the wafer 105 is accommodated into the wafer pocket 104, a center of the wafer 105 and a center of the wafer pocket 104 are aligned.

Figure 3:
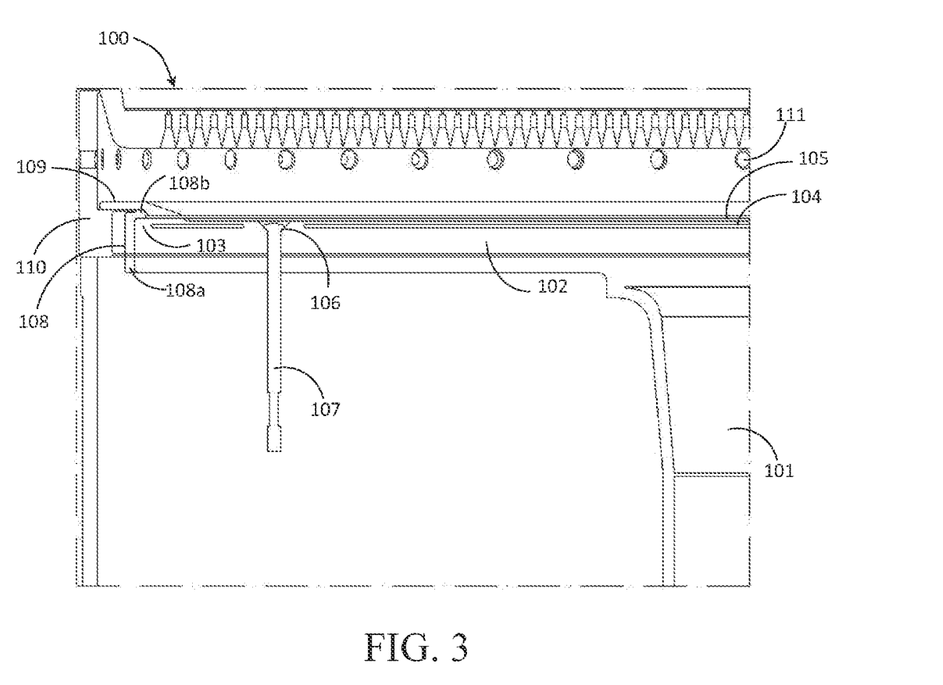
FIG. 3 is a partial cross-sectional view of matching and fitting of a side ring and a shadow ring of an apparatus for processing a wafer.

FIG. 3 shows that the pedestal 102 of the heater 101 in FIG. 2 ascends upward to drive the side ring 108 and the wafer 105 to rise together with the pedestal 102, until an upper surface of the side ring 108 matches and fits a lower surface of the shadow ring 109. As shown in FIG. 3, the top portion 108b of the side ring 108 includes a centripetal slant bevel, and the bottom portion of the shadow ring 109 includes a slant bevel that matches the centripetal slant bevel of the top portion 108b of the side ring 108 (details are shown below). Therefore, even if the shadow ring 109 and the side ring 108 are eccentric at the beginning of the contact, the shadow ring 109 may easily move to an optimal matching position along the matching centripetal slant bevel as the pedestal 102 rises, so that the upper surface of the side ring 108 finally matches and fits the lower surface of the shadow ring 109. After the upper surface of the side ring 108 matches and fits the lower surface of the shadow ring 109, the center of the shadow ring 109 is automatically aligned with the center of the side ring 108, and is automatically aligned with the center of the wafer 105 and the center of the wafer pocket 104.

Figure 4:
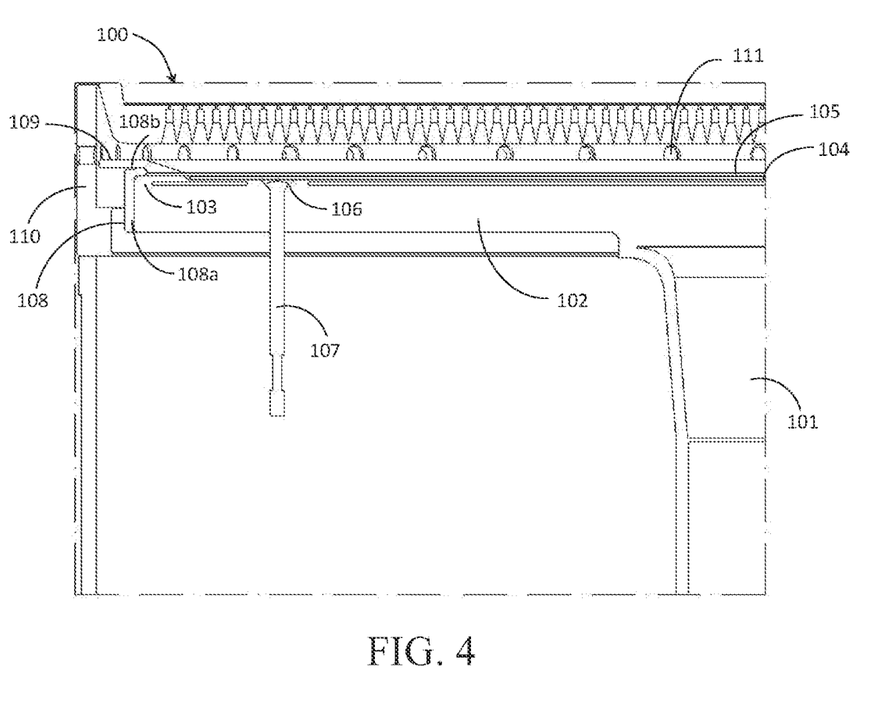
FIG. 4 is a partial cross-sectional view of moving a wafer to a predetermined processing position through an apparatus for processing a wafer.

FIG. 4 shows that the pedestal 102 of the heater 101 in FIG. 3 further ascends upward to drive the wafer 105, the side ring 108, and the shadow ring 109 to continue to rise together with the pedestal 102, until the upper surface of the shadow ring 109 reaches a predetermined processing position to perform the deposition processing. Preferably, the predetermined processing position is adjacent to a lower edge of the vent holes 111.

After the deposition processing is completed, the wafer 105 may be taken out through operations reverse to the operations shown in FIG. 1 to FIG. 4.

Figure 5:
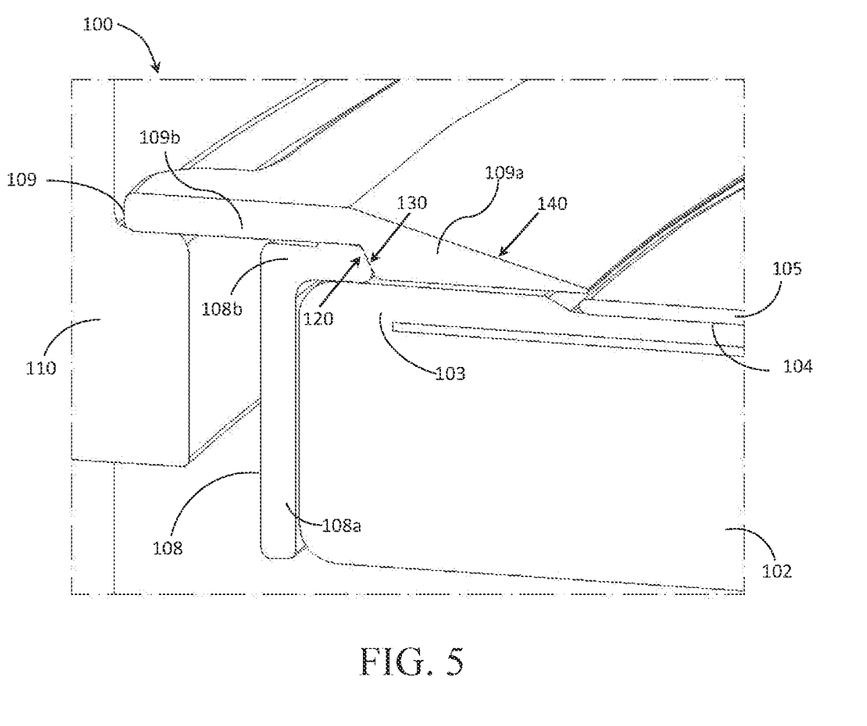
FIG. 5 is a partial enlarged view of completing the fitting shown in FIG. 3 through an apparatus for processing a wafer.

FIG. 5 is a partial enlarged view of the apparatus 100 for processing a wafer in the fitting state shown in FIG. 3. The side ring 108 includes an outer portion 108a and a top portion 108b. The outer portion 108a surrounds an outer side wall of the pedestal 102. The top portion 108b covers an outer portion of the annular edge step 103 of the pedestal 102 and includes a centripetal slant bevel 120.

A bottom portion of the shadow ring 109 may include a slant bevel 130 that matches the centripetal slant bevel 120 of the top portion of the side ring 108. When the centripetal slant bevel 120 of the top portion of the side ring 108 is in contact with the slant bevel 130 of the bottom portion of the shadow ring, a radial length of an edge of the wafer 105 covered by the shadow ring 109 may be, for example, less than or equal to 0.5 mm. In a preferred embodiment, the shadow ring 109 further includes a shielding portion 109a extending inward or centripetally from the slant bevel 130, and a supporting portion 109b extending outward from the slant bevel 130. In a preferred embodiment, the supporting portion 109b may be disposed on the step or the inner wall stopper of the inner side wall of the pumping ring 110. In another preferred embodiment, a top portion of the shielding portion 109a may further include a centripetal slant bevel 140. Preferably, the shadow ring 109 has a weight of about 90 g, and the side ring 108 has a weight of about 140 g. As shown in FIG. 5, the shielding portion 109a of the shadow ring 109 is not in contact with the edge of the wafer 105.

Figure 6:
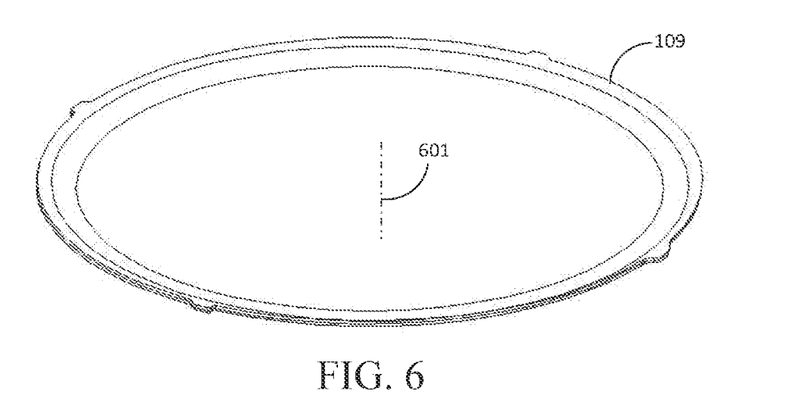
FIG. 6 is a schematic structural diagram of the shadow ring shown in FIG. 1 to FIG. 5.

FIG. 6 is a schematic structural diagram of the shadow ring 109 shown in FIG. 1 to FIG. 5. As shown in FIG. 6, the shadow ring 109 is symmetrical relative to a central axis 601 (not visible). When the center of the shadow ring 109 is automatically aligned with the centers of the wafer and the wafer pocket, a straight line (not visible) through the foregoing center points coincides with the central axis 601. In the embodiment of FIG. 6, the shadow ring 109 is provided with 4 supporting portions. In other embodiments, the shadow ring 109 may be provided with more or fewer supporting portions.

Figure 7:
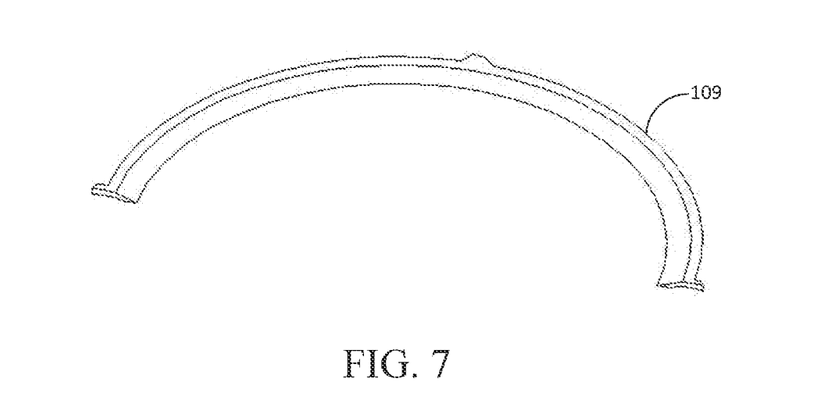
FIG. 7 is a schematic diagram of a half-cut structure of the shadow ring shown in FIG. 6.

FIG. 7 is a schematic diagram of a half-cut structure of the shadow ring 109 shown in FIG. 6, and a cross section thereof has the same shape as that of the shadow ring 109 shown in FIG. 1 to FIG. 5.

Figure 8:
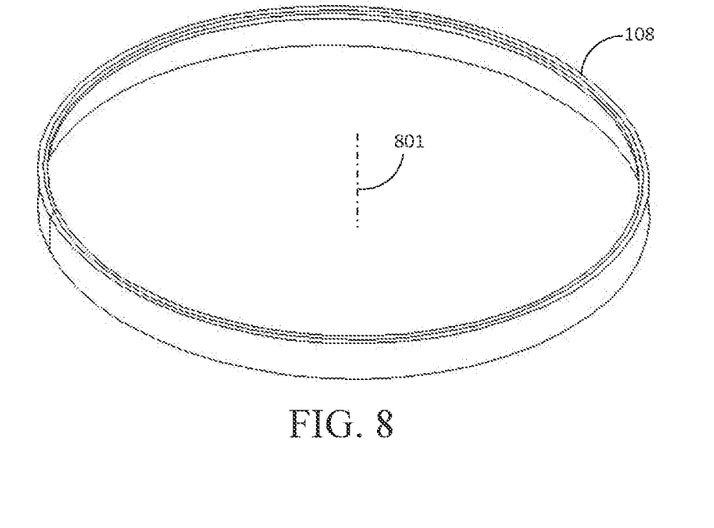
FIG. 8 is a schematic structural diagram of the side ring shown in FIG. 1 to FIG. 5.

FIG. 8 is a schematic structural diagram of the side ring 108 shown in FIG. 1 to FIG. 5. The side ring 108 is symmetrical relative to a central axis 801 (not visible). When the side ring 108 shown in FIG. 8 matches and fits the shadow ring 109 shown in FIG. 6, the central axis 801 of the side ring 108 coincides with the central axis 601 of the shadow ring 109.

Figure 9:
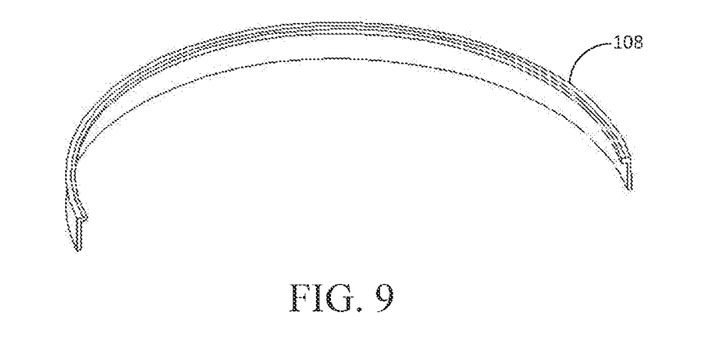
FIG. 9 is a schematic diagram of a half-cut structure of the side ring shown in FIG. 8.

FIG. 9 is a schematic diagram of a half-cut structure of the side ring 108 shown in FIG. 8, and a cross section thereof has the same shape as that of the side ring 108 shown in FIG. 1 to FIG. 5.

Figure 10:
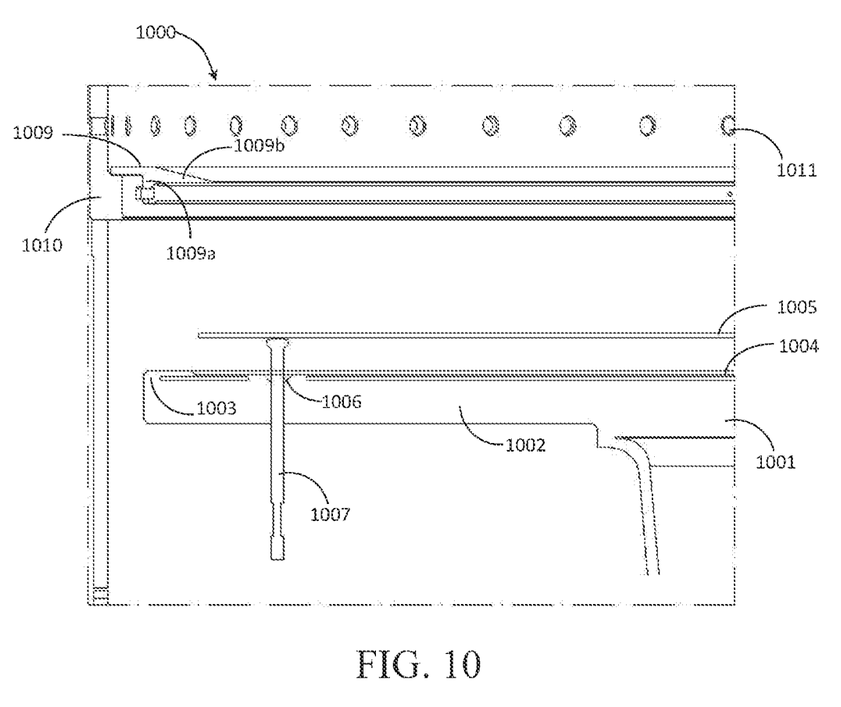
FIG. 10 is a partial cross-sectional view of providing a wafer to another apparatus for processing a wafer.

FIG. 10 is a partial cross-sectional view of an apparatus 1000 for processing a wafer. The apparatus 1000 for processing a wafer may be configured to, for example, implement deposition processing.

The apparatus 1000 for processing a wafer includes a heater 1001. The heater 1001 may heat a wafer to facilitate the deposition processing. As can be understood, the heater 1001 may alternatively not have or not enable a heating function. The heater may be a ceramic heater, an aluminum heater, or any suitable heater. A top portion of the heater 1001 includes a pedestal 1002. A top portion of the pedestal 1002 includes an annular edge step 1003 and a wafer pocket 1004. The wafer pocket 1004 is recessed relative to the annular edge step 1003 to accommodate or receive a wafer 1005. From a top view, the annular edge step 1003 surrounds or encloses the wafer pocket 1004. When the wafer pocket 1004 accommodates or receives the wafer 1005, the annular edge step 1003 surrounds or encloses both the wafer pocket 1004 and the wafer 1005 therein. In a preferred embodiment, a through hole 1006 and a lifter pin 1007 may be included in a region of the wafer pocket 1004 of the pedestal 1002. The through hole 1006 penetrates the pedestal 1002. The lifter pin 1007 may move up and down in the through hole 1006. A top portion of the through hole 1006 may be provided with a receiving groove. A top portion of the lifter pin 1007 may be provided with a protruding portion. The lifter pin 1007 may stop moving down due to the protruding portion thereof being received into the receiving groove of the through hole 1006. Although FIG. 10 merely shows one through hole 1006 and one lifter pin 1007, a person skilled in the art may understand that more through holes 1006 and/or more lifter pins 1007 may be included in the region of the wafer pocket 1004.

The apparatus 1000 for processing a wafer further includes a shadow ring 1009. The shadow ring 1009 includes a side wall 1009a and a shielding portion 1009b extending inward or centripetally from the side wall 1009a. When the shadow ring 1009 is disposed on the pedestal 1002, the side wall 1009a surrounds an outer side wall of the pedestal 1002, and the shielding portion 1009b covers and extends beyond the annular edge step 1003. In a preferred embodiment, a top portion of the shielding portion 1009b may include a centripetal slant bevel. In another preferred embodiment, the shadow ring 1009 may further include a supporting portion extending outward from the side wall 1009a. In the embodiment shown in FIG. 10, the pedestal 1002 of the heater 1001 is located below the shadow ring 1009 and separated from the shadow ring 1009. The wafer 1005 is suspended above the wafer pocket 1004 by the support of the lifter pin 1007.

In a preferred embodiment, the apparatus 1000 for processing a wafer may include a pumping ring 1010. The deposition processing may be implemented on the wafer 1005 in a substantially enclosed region formed by the wafer pocket 1004, the pumping ring 1010, and a showerhead above the wafer 1005. Preferably, a side wall of the pumping ring 1010 may further include one or more vent holes 1011. The vent holes 1011 may be connected to an external vacuum pump (not shown) to extract reaction gas. An inner side wall of the pumping ring 1010 may include a step or an inner wall stopper to support the shadow ring 1009. Preferably, the step or the inner wall stopper on the inner side wall of the pumping ring 1010 may merely support the supporting portion of the shadow ring 1009. As can be understood, the shadow ring 1009 may alternatively be separately suspended above the heater 1001 without relying on the support of the step or the inner wall stopper.

Figure 11:
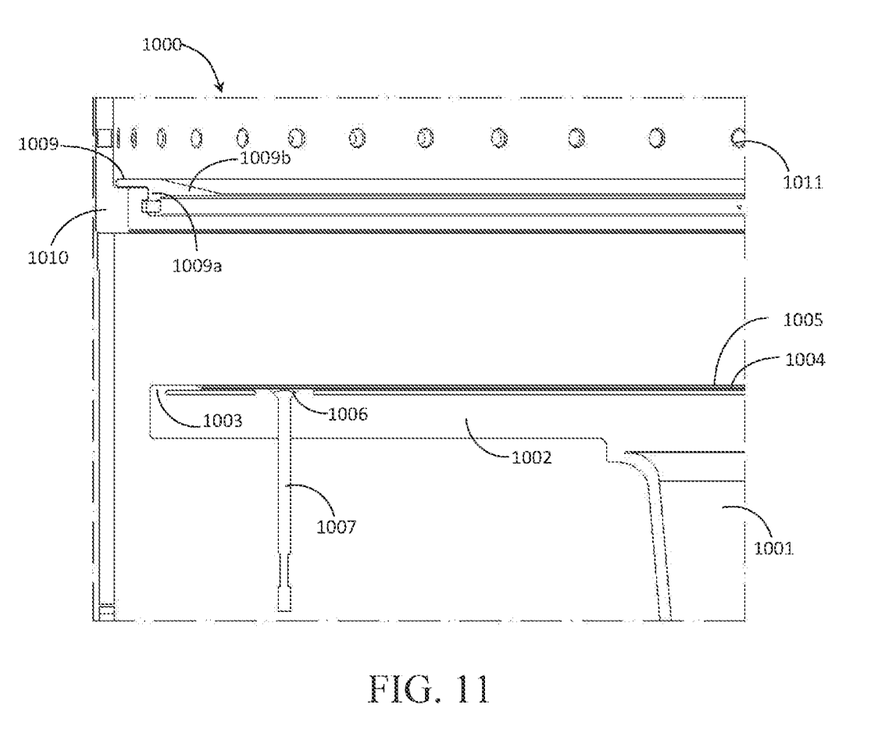
FIG. 11 is a partial cross-sectional view of accommodating a wafer into a wafer pocket of another apparatus for processing a wafer.

FIG. 11 shows that the lifter pin 1007 in FIG. 10 descends to guide the wafer 1005 to descend and to be accommodated into the wafer pocket 1004 to be in direct contact with a surface of the wafer pocket 1004. After the wafer 1005 is accommodated into the wafer pocket 1004, a center of the wafer 1005 and a center of the wafer pocket 1004 are aligned.

Figure 12:
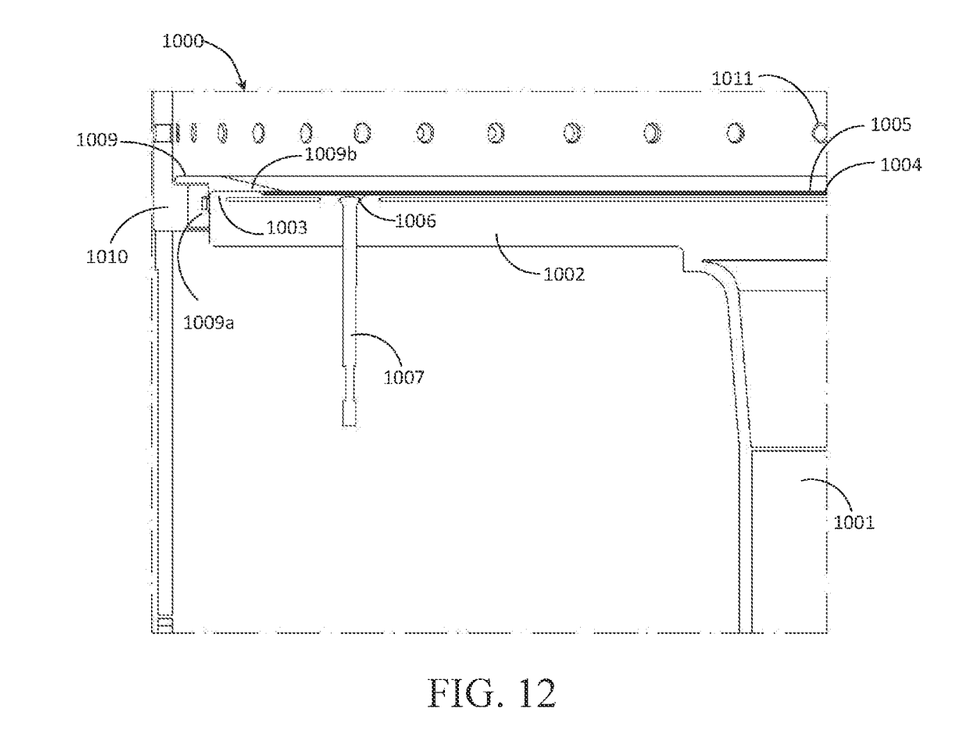
FIG. 12 is a partial cross-sectional view of matching and fitting of a pedestal and a shadow ring of another apparatus for processing a wafer.

FIG. 12 shows that the pedestal 1002 of the heater 1001 in FIG. 11 ascends upward to drive the wafer 1005 to rise together with the pedestal 1002, until an upper surface of the annular edge step 1003 of the top portion of the pedestal 1002 comes into contact with, and matches and fits the shielding portion 1009b of the shadow ring 1009. After the upper surface of the annular edge step 1003 comes into contact with the shielding portion 1009b of the shadow ring 1009, the center of the shadow ring 1009 is automatically aligned with the center of the wafer 1005 and the center of the wafer pocket 1004.

Figure 13:
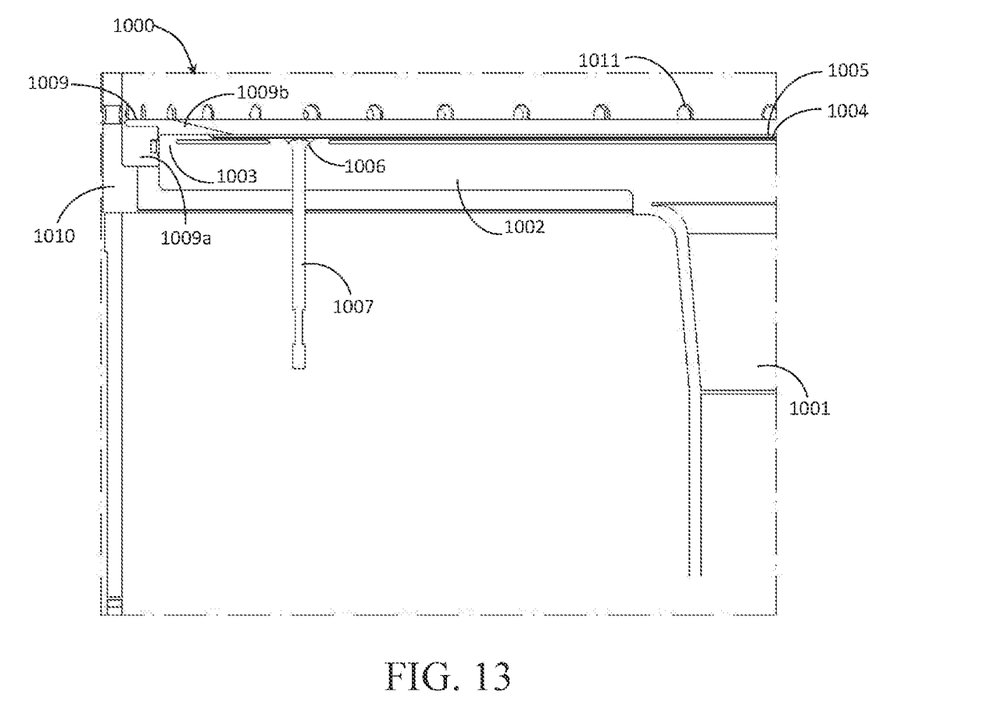
FIG. 13 is a partial cross-sectional view of moving a wafer to a predetermined processing position through another apparatus for processing a wafer.

FIG. 13 shows that the pedestal 1002 of the heater 1001 in FIG. 12 further ascends upward to drive the wafer 1005 and the shadow ring 1009 to continue to rise together with the pedestal 1002, until the upper surface of the shadow ring 1009 reaches a predetermined processing position to perform the deposition processing. Preferably, the predetermined processing position is adjacent to a lower edge of the vent holes 1011.

After the deposition processing is completed, the wafer 1005 may be taken out through operations reverse to the operations shown in FIG. 10 to FIG. 13.

Figure 14:
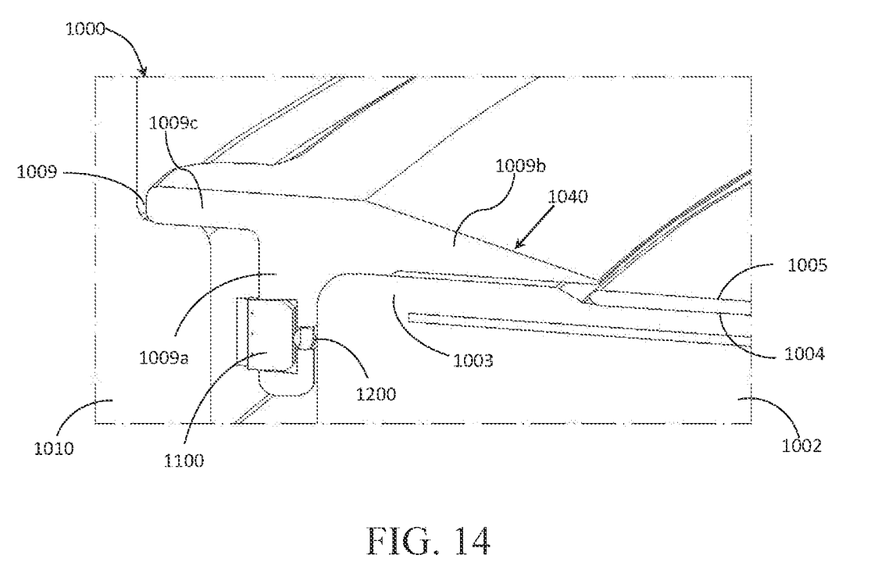
FIG. 14 is a partial enlarged view of completing the fitting shown in FIG. 12 through another apparatus for processing a wafer.

FIG. 14 is a partial enlarged view of the apparatus 1000 for processing a wafer in the fitting state shown in FIG. 12. A shape of the bottom portion formed by the side wall 1009a and the shielding portion 1009b of the shadow ring 1009 may match a shape of the edge of the pedestal 1002. When the upper surface of annular edge step 1003 of the top portion of the pedestal 1002 is in contact with the shielding portion 1009b of the shadow ring 1009, a radial length of an edge of the wafer 1005 covered by the shadow ring 1009 may be, for example, less than or equal to 0.5 mm. In a preferred embodiment, the shadow ring 1009 may further include a supporting portion 1009c extending outward from the side wall 1009a. In a preferred embodiment, a bottom portion edge of the side wall 1009a or an outer edge of the annular edge step 1003 may include an arc chamfer to facilitate fitting. In a preferred embodiment, a top portion of the shielding portion 1009b may include a centripetal slant bevel 1040. In another preferred embodiment, the shadow ring 109 has a weight of about 210 g. As shown in FIG. 14, the shielding portion 1009b of the shadow ring 1009 is not in contact with the edge of the wafer 1005.

The side wall 1009a of the shadow ring 1009 may include one or more through holes and one or more anti-wear balls 1200 (merely one through hole and one anti-wear ball are shown in FIG. 14 for purpose of illustration). The friction can be reduced by using the one or more anti-wear balls 1200 when the shadow ring 1009 fits the annular edge step 1003. In a preferred embodiment, the one or more anti-wear balls 1200 may be further held in the one or more through holes by a screw(s) 1100. Preferably, the one or more anti-wear balls 1200 may be sapphire balls or any other suitable materials.

Figure 15:
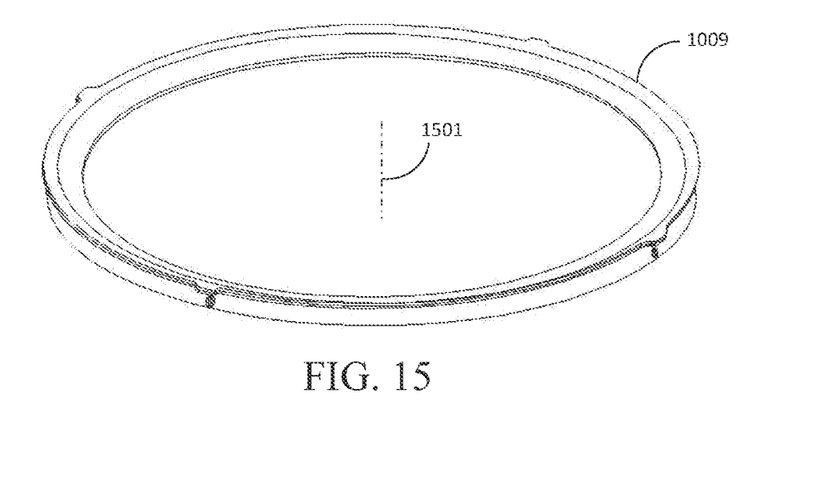
FIG. 15 is a schematic structural diagram of the shadow ring shown in FIG. 10 to FIG. 13.

FIG. 15 is a schematic structural diagram of the shadow ring 1009 shown in FIG. 10 to FIG. 14. As shown in FIG. 15, the shadow ring 1009 is symmetrical relative to a central axis 1501 (not visible). When the center of the shadow ring 1009 is automatically aligned with the centers of the wafer and the wafer pocket, a straight line (not visible) through the foregoing center points coincides with the central axis 1501. In the embodiment of FIG. 15, the shadow ring 1009 is provided with 4 supporting portions and 4 through holes (anti-wear balls may be placed in the through holes). In other embodiments, the shadow ring 1009 may be provided with more or fewer supporting portions and/or through holes. The quantity of supporting portions is not necessarily consistent with the quantity of through holes.

Figure 16:
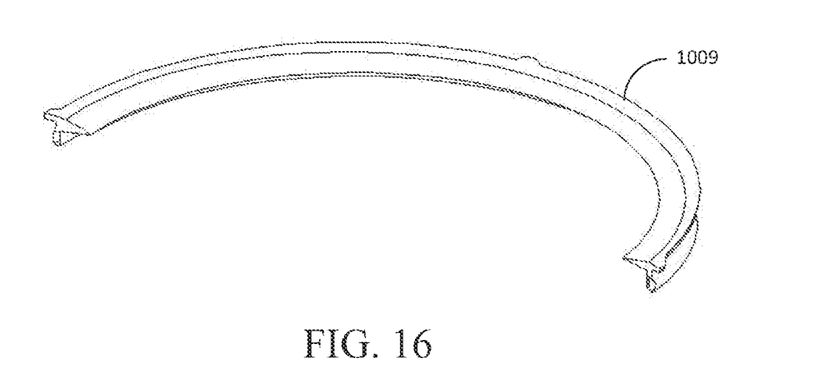
FIG. 16 is a schematic diagram of a half-cut structure of the shadow ring shown in FIG. 15.

FIG. 16 is a schematic diagram of a half-cut structure of the shadow ring 1009 shown in FIG. 15, and a cross-section thereof has the same shape as that of the shadow ring 1009 shown in FIG. 10 to FIG. 14.

Figure 17:
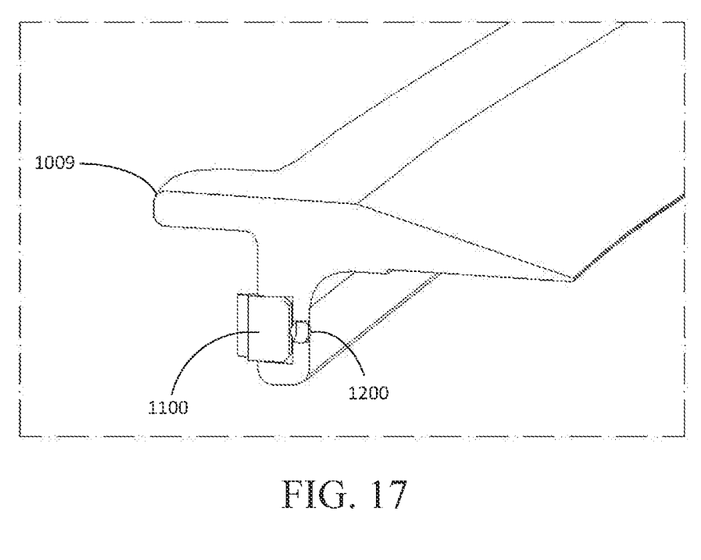
FIG. 17 is a partial enlarged view of the shadow ring including a screw and an anti-wear ball in FIG. 14 to FIG. 16.

FIG. 17 is a partial enlarged view of the shadow ring 1009 including a screw 1100 and an anti-wear ball 1200 in FIG. 14 to FIG. 16.

The apparatus and the method for processing a wafer provided by various embodiments of the present disclosure can ensure that a center of a shielding component and a center of a wafer or a substrate are always automatically aligned without eccentricity or uneven shielding in an entire deposition process, and prevent a film formed by the deposition processing from unfavorably extending to an edge and a side of the wafer to cause the film to break and form defects on the surface of the film, while there is no need to significantly increase costs and process complexity.

The technical contents and technical features of the present invention have been described by using the foregoing related embodiments. However, the foregoing embodiments are merely examples for implementing the present invention. A person skilled in the art may still make replacements and modifications based on the teachings and the disclosures of the present invention without departing from the spirit of the present invention. Therefore, the disclosed embodiments of the present invention do not limit the scope of the present invention. On the contrary, modifications and equivalent arrangements included in the spirit and scope of the claims are all included in the scope of the present invention.

What is claimed is:

1. A method for processing a wafer by using an apparatus, wherein the apparatus comprises: a heater comprising a pedestal, wherein a top portion of the pedestal comprises an annular edge step and a wafer pocket recessed relative to the annular edge step to accommodate a wafer; a side ring comprising an outer portion and a top portion, wherein the outer portion surrounds an outer side wall of the pedestal, and the top portion covers an outer portion of the annular edge step and comprises a centripetal slant bevel; and a shadow ring, a bottom portion thereof comprising a slant bevel matching the centripetal slant bevel of the top portion of the side ring; and wherein the method comprises:

placing a wafer in the wafer pocket; and
lifting the pedestal and the side ring, so that the centripetal slant bevel of the top portion of the side ring comes into contact with the slant bevel of the bottom portion of the shadow ring,
wherein the shadow ring is disposed on an inner wall stopper of a pumping ring, and the method further comprises continuing to lift the pedestal and the side ring, to drive the shadow ring to depart from the inner wall stopper and move to a predetermined processing position.

2. The method according to claim 1, wherein the shadow ring further comprises a shielding portion extending inward from the slant bevel.

3. The method according to claim 2, wherein a top portion of the shielding portion comprises a centripetal slant bevel.

4. The method according to claim 1, wherein a side wall of the pumping ring comprises one or more vent holes.

5. The method according to claim 1, wherein placing the wafer in the wafer pocket comprises: placing the wafer on one or more lifter pins in the wafer pocket, and lowering the one or more lifter pins to lower the wafer into the wafer pocket.

6. The method according to claim 1, wherein when the centripetal slant bevel of the top portion of the side ring comes into contact with the slant bevel of the bottom portion of the shadow ring, a radial length of an edge of the wafer covered by the shadow ring is less than or equal to 0.5 mm.

7. The method according to any one of claims 1 and 2-6, wherein the heater is a ceramic heater or an aluminum heater.

* * * * *